(12) United States Patent
Usami

(10) Patent No.: US 7,800,200 B2
(45) Date of Patent: Sep. 21, 2010

(54) WIRELESS IC TAG AND METHOD FOR MANUFACTURING SAME

(75) Inventor: Mitsuo Usami, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 487 days.

(21) Appl. No.: 11/722,942

(22) PCT Filed: Feb. 24, 2005

(86) PCT No.: PCT/JP2005/003025

§ 371 (c)(1),
(2), (4) Date: Jun. 27, 2007

(87) PCT Pub. No.: WO2006/090459

PCT Pub. Date: Aug. 31, 2006

(65) Prior Publication Data

US 2007/0285254 A1    Dec. 13, 2007

(51) Int. Cl.
*H01L 21/8234* (2006.01)

(52) U.S. Cl. ............ 257/536; 340/572.7; 257/E21.62; 257/E21.627

(58) Field of Classification Search ............ 257/536; 340/572.7
See application file for complete search history.

(56) References Cited

U.S. PATENT DOCUMENTS 6,617,172 B2    9/2003  Usami ............ 438/2
6,660,589 B2   12/2003  Park  ............ 438/257

FOREIGN PATENT DOCUMENTS

| JP | 57-72364    | 5/1982 |
| JP | 2002-184872 | 6/2002 |
| JP | 2003-209194 | 7/2003 |

*Primary Examiner*—Alexander G Ghyka
(74) *Attorney, Agent, or Firm*—Miles & Stockbridge P.C.

(57) ABSTRACT

A wireless IC tag is provided with a memory circuit including a ROM in which an identification number is written, and a pulse width detection circuit having divided resistors and a capacitor for detecting a signal waveform from a reader. In order to prevent the increase in the number of process steps and photomasks, a resistance value of the pulse width detection circuit is adjusted by an electron beam writing method while utilizing a step of writing an identification number unique to the wireless IC tag into the ROM of the memory circuit.

6 Claims, 19 Drawing Sheets

WIRELESS IC TAG AND METHOD FOR MANUFACTURING SAME

TECHNICAL FIELD

The present invention relates to a wireless IC tag and a method for manufacturing the same. More particularly, it relates to an improvement in performance of a wireless IC tag and a technology for manufacturing the IC tag at low cost.

BACKGROUND ART

A wireless IC tag is a non-contact type tag in which desired data is written in a memory circuit in a semiconductor chip and the data is read by using a radio transmission such as microwave.

As a method for providing a unique identification number to each wireless IC tag, Japanese Patent Application Laid-Open Publication No. 2002-184872 (Patent Document 1) discloses a method in which a random number is generated in advance by a program to generate an identification number, and contact holes and through holes are formed in a memory circuit by using an electron beam writing method in a semiconductor wafer diffusion process so as to write the identification number in accordance with the presence of the contact holes and through holes.

Patent Document 1: Japanese Patent Application Laid-Open Publication No. 2002-184872

DISCLOSURE OF THE INVENTION

In recent years, it is a main object for a wireless IC tag to achieve enhanced function and cost reduction. As a method for providing further functions to a wireless IC tag, a method in which a plurality of clock signals having different pulse widths are used to form the clock signals transmitted from a reader to a wireless IC tag so as to increase the amount of information is known. According to this method, since only a pulse width detection circuit for detecting a pulse width of a clock signal based on time constants of a resistance value and a capacitance value is additionally provided to a semiconductor chip in the wireless IC tag, enhanced function of the wireless IC tag can be achieved without significantly increasing the circuit size formed in the semiconductor chip.

In order to detect a plurality of clock signals having different pulse widths with high accuracy as described above, it is required to control either or both of the resistance value and the capacitance value formed in the pulse width detection circuit with high accuracy. However, it is difficult to repeatedly manufacture the uniform resistance and capacitance values due to variation in the manufacturing conditions.

Therefore, in order to control the resistance and capacitance values with high accuracy, it is required to correct the resistance and capacitance values during the semiconductor manufacturing process. For example, in order to correct the resistance value, an interval between through holes connecting a resistor and a wiring is changed. More specifically, three or more candidate positions of the through holes connecting the resistor and the wiring are previously provided, and then it is determined whether to adjust the resistance value based on a deviation between an actual measurement value and a reference value of the resistance. When it is determined that adjustment is necessary, the resistance value is set and a length of the resistor corresponding to this resistance value is obtained. Then, two out of three or more candidate positions of the through holes are selected based on the resistor length, and the through holes are formed therein. The capacitance value can be corrected in the same manner.

However, a through hole forming step as described above added in the middle of the semiconductor manufacturing process causes cost increase due to the increase in the number of steps. Also, when the through hole is formed by a photo-resist technology using a photomask, cost for creating the photomask is also added, and thus, it is difficult to achieve both the enhanced function and the cost reduction of the wireless IC tag.

An object of the present invention is to provide a technology capable of achieving an advanced wireless IC tag without causing significant increase in manufacturing cost.

The above and other objects and novel characteristics of the present invention will be apparent from the description of this specification and the accompanying drawings.

The typical ones of the inventions disclosed in this application will be briefly described as follows.

A wireless IC tag according to the present invention comprises: a semiconductor chip in which a memory circuit having a ROM in which a unique identification number is written and a pulse width detection circuit for detecting a plurality of clock signals having different pulse widths transmitted from a reader based on resistance and capacitance values are formed, wherein the identification number is written into the ROM depending on the presence of a first through hole which conducts between upper and lower layer wirings connected to a transistor constituting the ROM, the resistance value of the pulse width detection circuit is controlled by a position of a second through hole which conducts between upper and lower layer wirings connected to the resistor, and the first through hole and the second through hole are formed in the same insulating layer on the semiconductor chip.

An aspect of a method for manufacturing the above-described wireless IC tag comprises the steps of:

(a) forming semiconductor devices including a transistor constituting the ROM of the memory circuit and a resistor constituting the pulse width detection circuit through a semiconductor wafer diffusion process;

(b) forming a first lower layer wiring connected to the transistor and a second lower layer wiring connected to the resistor on the transistor and the resistor;

(c) after forming an insulating film on the first and second lower layer wirings, forming a first through hole in the insulating film on the first lower layer wiring and a second through hole in the insulating film on the second lower layer wiring; and (d) forming a first upper layer wiring connected to the first lower layer wiring via the first through hole and a second upper layer wiring connected to the second lower layer wiring via the second through hole, on the insulating film in which the first and second through holes are formed.

The effects obtained by typical aspects of the present invention will be briefly described below.

It is possible to achieve an advanced wireless IC tag without causing significant increase in manufacturing cost.

BRIEF DESCRIPTIONS OF THE DRAWINGS

BEST MODE FOR CARRYING OUT THE INVENTION

Hereinafter, embodiments of the present invention will be described in detail with reference to the accompanying drawings.

Figure 1:
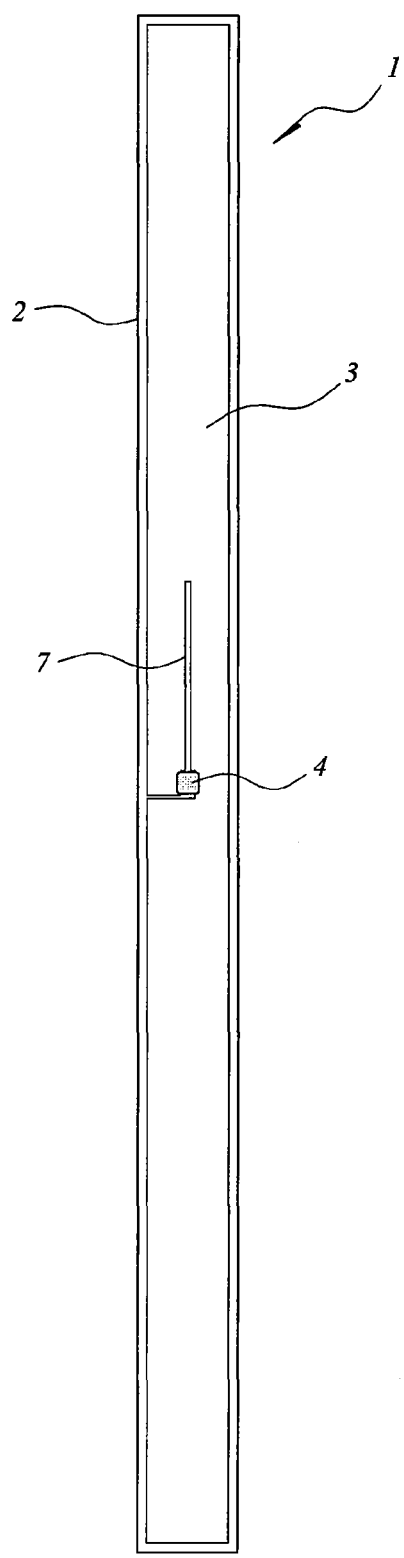
FIG. 1 is a plan view (front side) showing a wireless IC tag according to one embodiment of the present invention.
Figure 2:
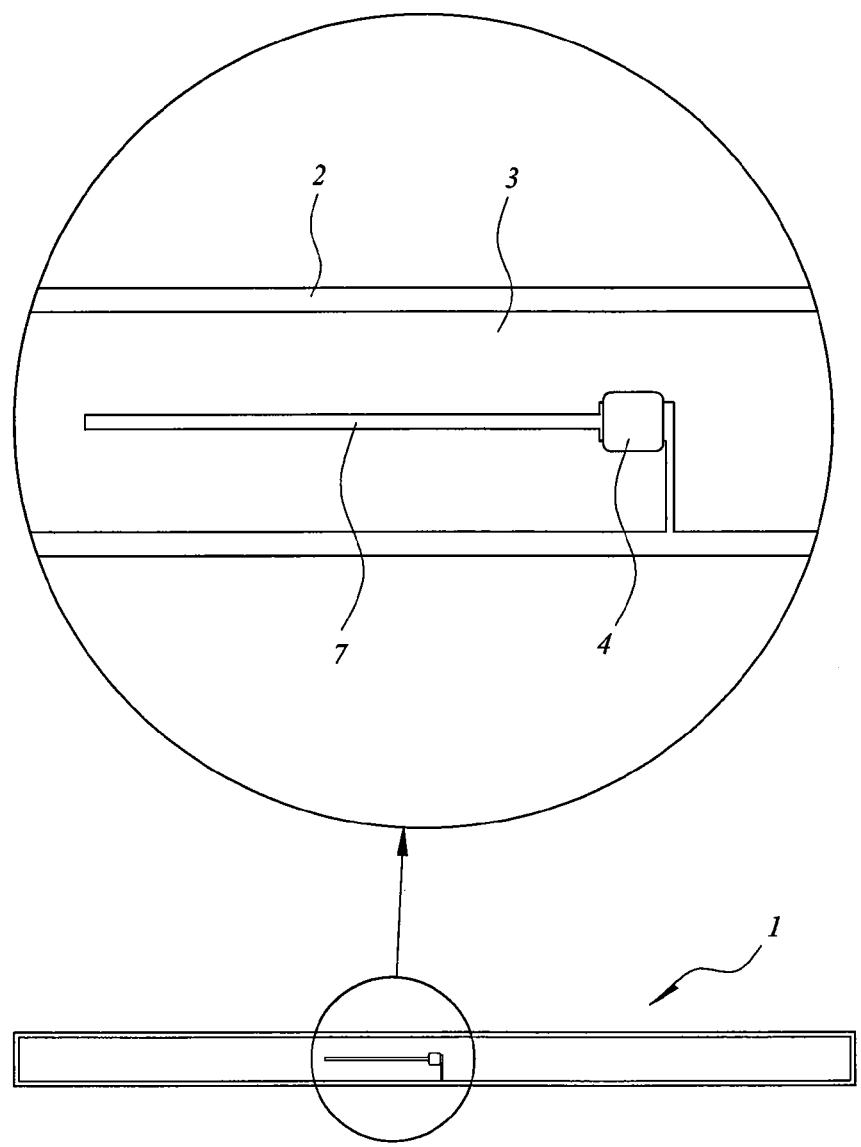
FIG. 2 is a plan view showing a part of FIG. 1 in an enlarged manner.
Figure 3:
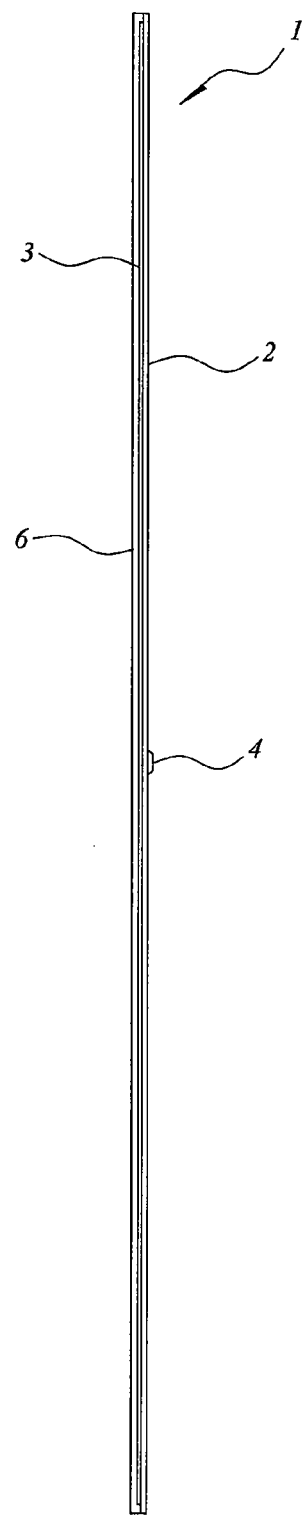
FIG. 3 is a side view showing the wireless IC tag according to one embodiment of the present invention.
Figure 4:
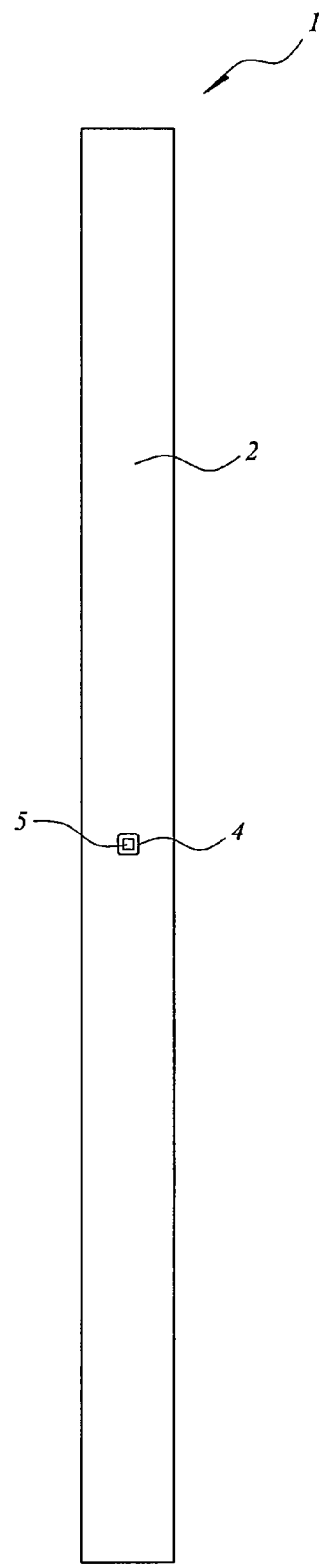
FIG. 4 is a plan view (rear side) showing the wireless IC tag according to one embodiment of the present invention.
Figure 5:
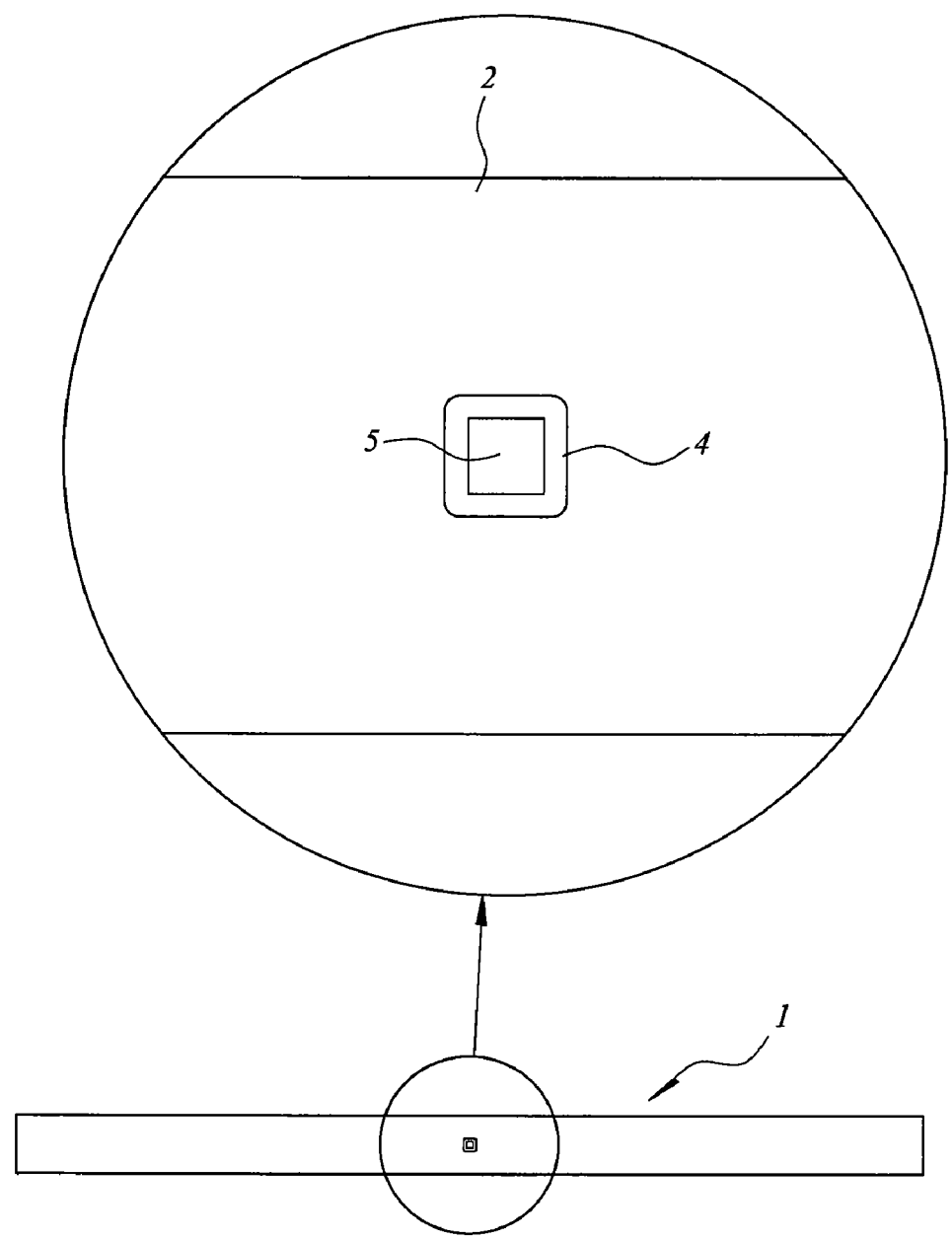
FIG. 5 is a plan view showing a part of FIG. 4 in an enlarged manner.

FIG. 1 is a plan view (front side) showing a wireless IC tag according to the present embodiment, FIG. 2 is a plan view showing a part of FIG. 1 in an enlarged manner, FIG. 3 is a side view showing the wireless IC tag according to the present embodiment, FIG. 4 is a plan view (rear side) showing the wireless IC tag according to the present embodiment, and FIG. 5 is a plan view showing a part of FIG. 4 in an enlarged manner.

A wireless IC tag 1 according to the present embodiment comprises an antenna 3 made of Cu foil attached on one surface of a rectangular insulating film 2 having a small width, and a semiconductor chip 5 connected to the antenna 3 with its front surface and side surfaces sealed by potting resin 4. On one surface of the insulating film 2 (surface on which the antenna 3 is formed), a cover film 6 for protecting the antenna 3 and the semiconductor chip 5 is laminated according to need.

A length of the antenna 3 along the longitudinal side of the insulating film 2 is optimized so as to efficiently receive a microwave with a frequency of 2.45 GHz (for example, 56 mm). Also, a width of the antenna 3 is optimized so as to achieve both size reduction and sufficient strength of the wireless IC tag 1 (for example, 3 mm).

An L-shaped slit 7 one end of which reaches an outer edge of the antenna 3 is formed substantially at the center of the antenna 3, and the semiconductor chip 5 sealed by the potting resin 4 is mounted in the middle of this slit 7.

Figure 6:
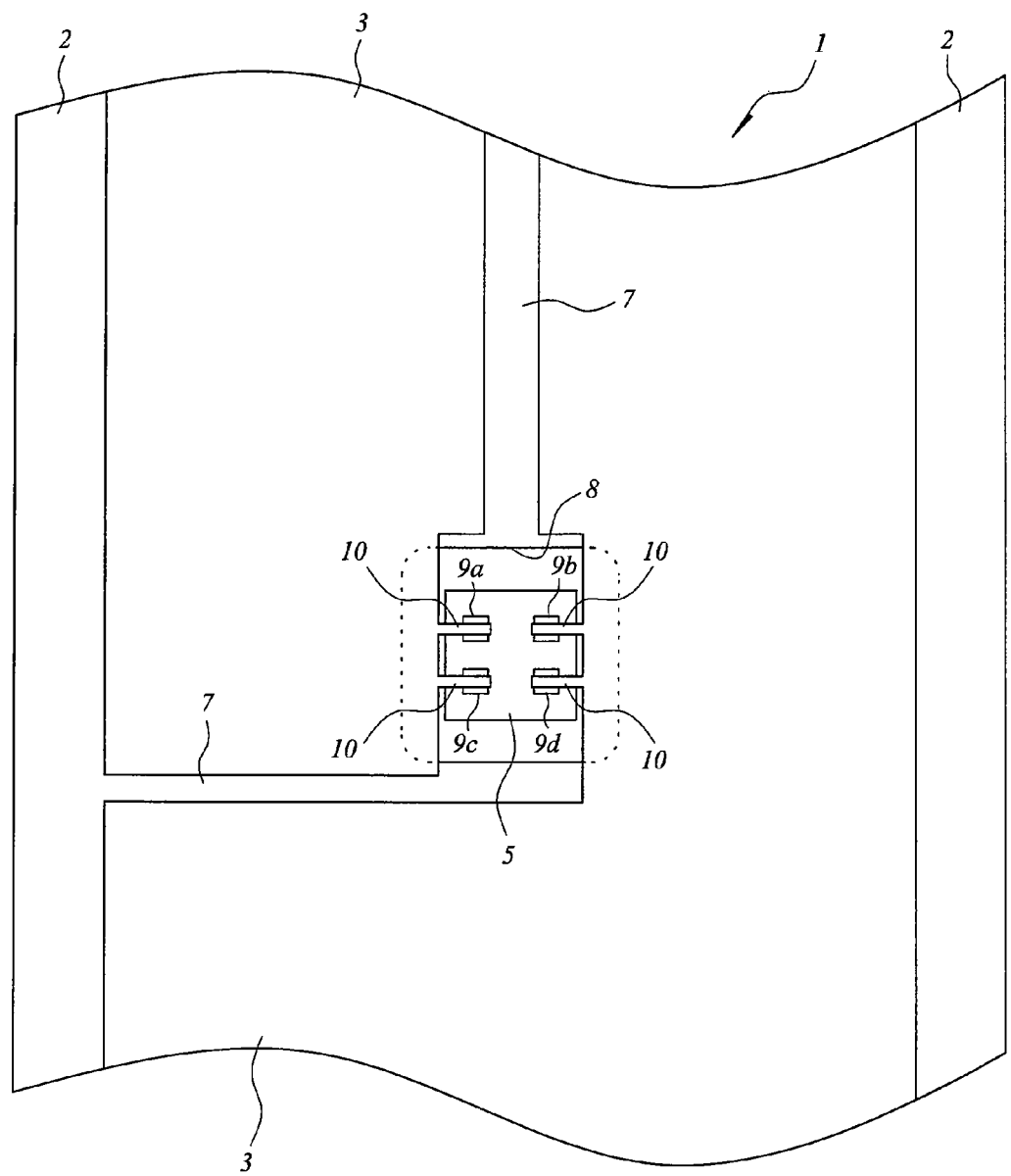
FIG. 6 is an enlarged plan view (front side) of essential parts of the wireless IC tag according to one embodiment of the present invention.
Figure 7:
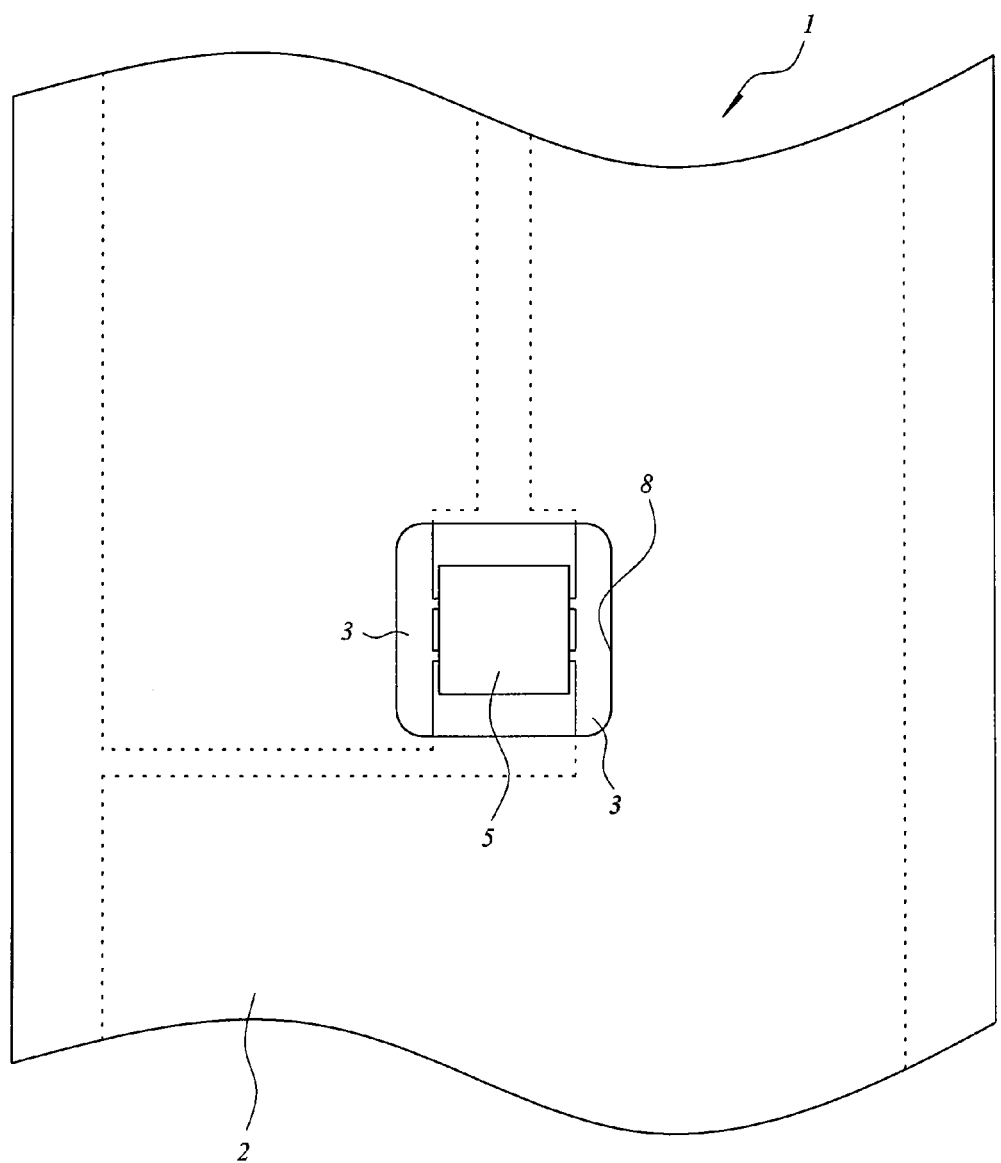
FIG. 7 is an enlarged plan view (rear side) of essential parts of the wireless IC tag according to one embodiment of the present invention.

FIG. 6 and FIG. 7 are plan views snowing the part near the center of the antenna 3 in which the slit 7 is formed in an enlarged manner, in which FIG. 6 shows a front side of the wireless IC tag 1 and FIG. 7 shows a rear side thereof, respectively. In these drawings, the illustrations of the potting resin 4 sealing the semiconductor chip 5 and the cover film 6 are omitted.

A device hole 8 formed by punching a part of the insulating film 2 is formed in the middle of the slit 7 formed in the antenna 3, and the semiconductor chip 5 is disposed at the center of this device hole 8. Dimensions of the semiconductor chip 5 are about 0.48 mm×0.48 mm.

As shown in FIG. 6, for example, four Au bumps 9a, 9b, 9c and 9d are formed on a main surface of the semiconductor chip 5. The Au bumps 9a, 9b, 9c and 9d are formed by using, for example, a well-known electrolytic plating method and have a height of about 15 μm. Also, leads 10 integrally formed with the antenna 3 and having one ends extending toward the inside of the device hole 8 are connected to the respective Au bumps 9a, 9b, 9c and 9d. Two leads 10 out of them extend from one side of the antenna 3, which is divided into two parts by the slit 7, to the inside of the device hole 8 and are electrically connected to the Au bumps 9a and 9c of the semiconductor chip 5. The remaining two leads 10 extend from the other side of the antenna 3 to the inside of the device hole 8 and are electrically connected to the Au bumps 9b and 9d of the semiconductor chip 5.

Figure 8:
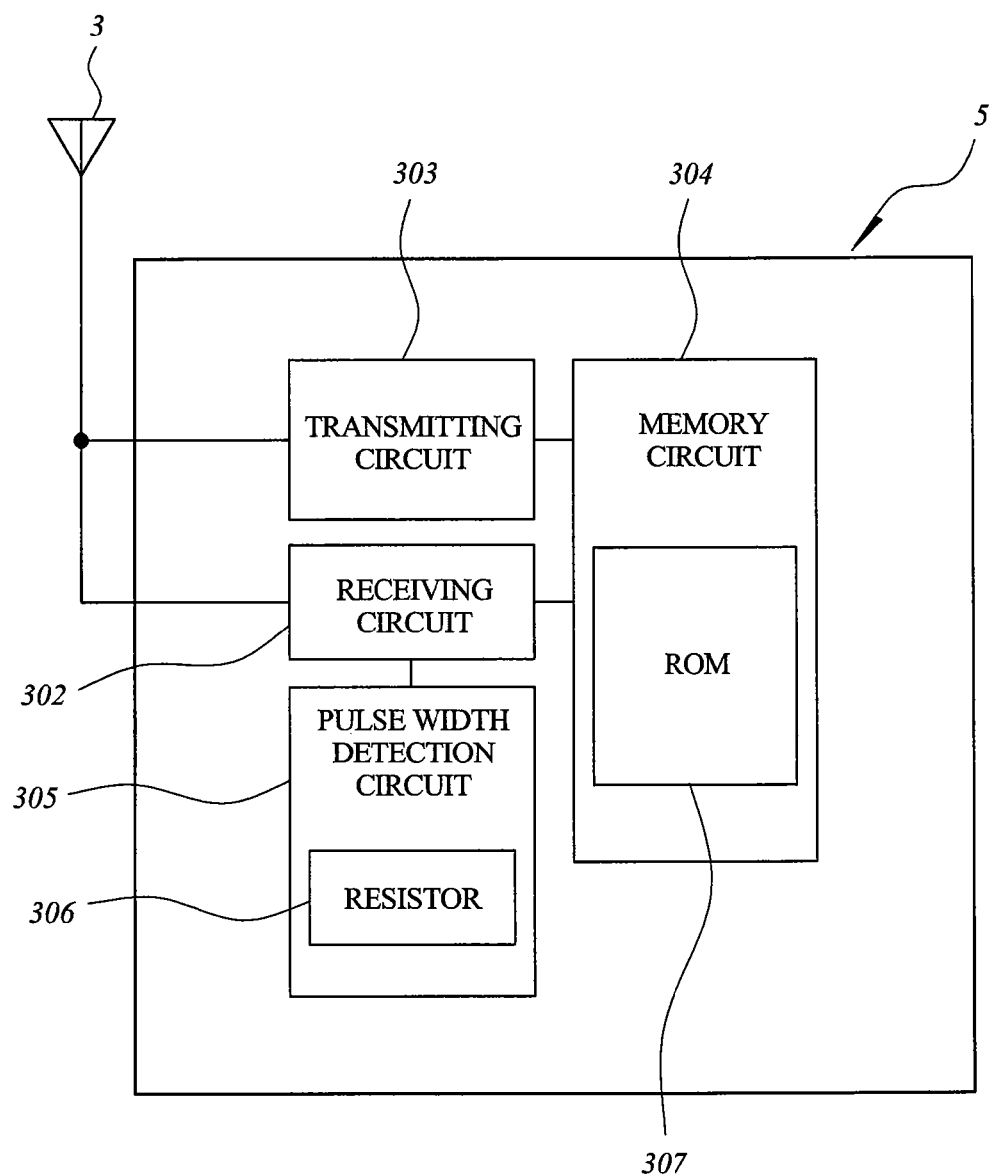
FIG. 8 is a block diagram of a circuit formed in a semiconductor chip of the wireless IC tag according to one embodiment of the present invention.

FIG. 8 is a block diagram of a circuit formed in the semiconductor chip 5. The semiconductor chip 5 is made of a single crystal silicon substrate with a thickness of about 0.15 mm, and a receiving circuit 302, a transmitting circuit 303, a memory circuit 304, a pulse width detection circuit 305 and the like which operate in response to signals from the reader are formed on the main surface thereof. The receiving circuit 302 and the transmitting circuit 303 are connected to the antenna 3 and the memory circuit 304. Also, the receiving circuit 302 is connected to the pulse width detection circuit 305. The pulse width detection circuit 305 includes a resistor 306 whose resistance value is adjusted by an electron beam writing method.

The memory circuit 304 includes a ROM 307 with a 128-bit memory capacity. The memory capacity of 128 bits is only one example, and a ROM with larger or smaller capacity is also available. An identification number of the wireless IC tag 1 is written in this ROM 307. In order to write the identification number in the ROM 307, as described later, through holes are formed in an insulating film by using the electron beam writing method in a semiconductor wafer diffusion process.

Figure 9:
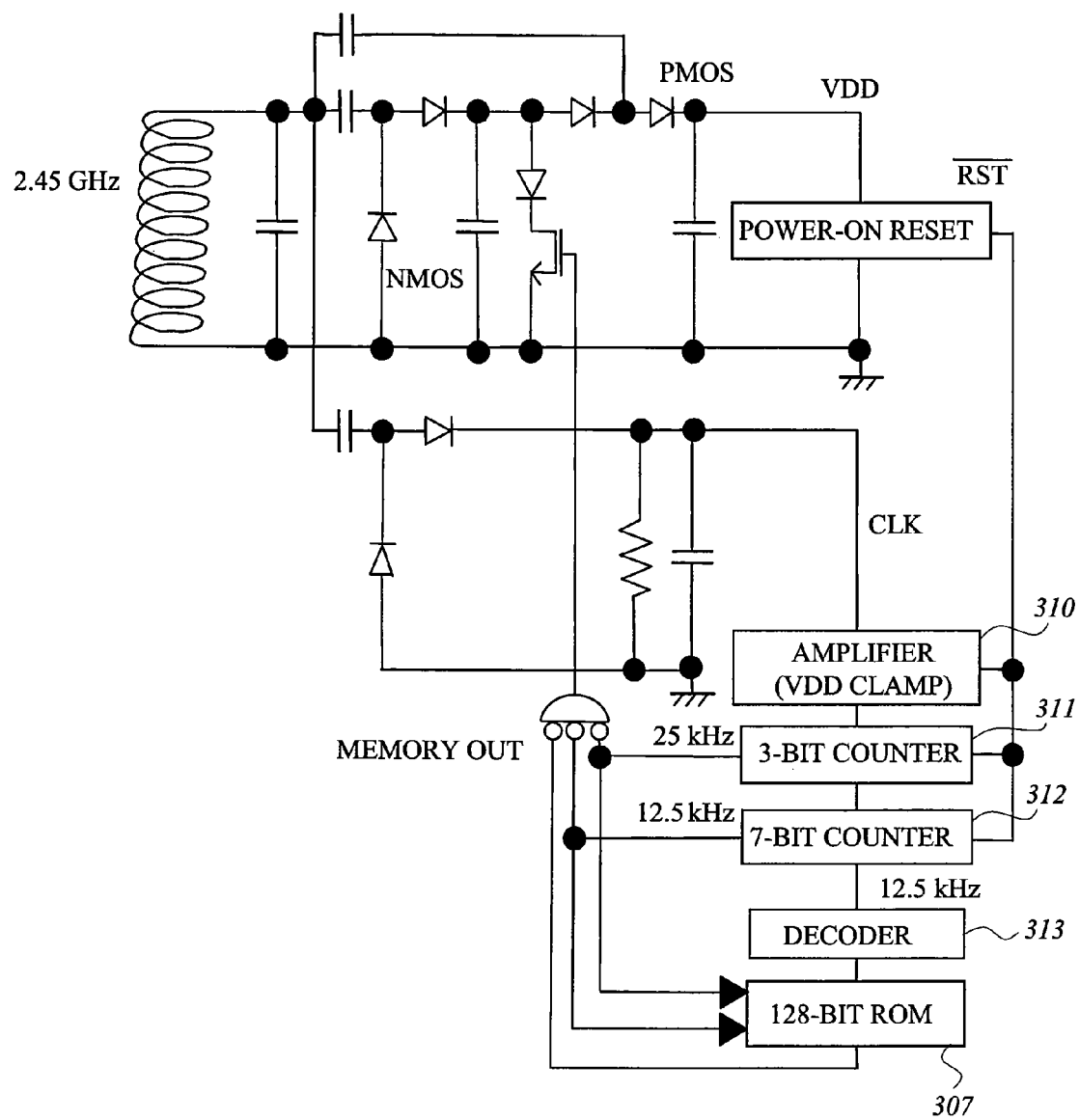
FIG. 9 is a diagram of a circuit formed in the semiconductor chip of the wireless IC tag according to one embodiment of the present invention.

FIG. 9 is a diagram showing a part of a circuit formed on the semiconductor chip 5. In order to operate the wireless IC tag 1 without a battery, since energy needs to be received through radio waves, a rectifier circuit for converting an electromagnetic wave into a DC power is required. For example, the rectifier circuit is achieved by a combination of capacitors and diodes. When a carrier wave from the reader and a modulated clock signal reach the semiconductor chip 5 of the wireless IC tag 1, the clock signal is demodulated and amplified in an amplifier 310 to be inputted into a 3-bit counter 311. A carry of the 3-bit counter 311 is inputted into a 7-bit counter 312 to be sequentially counted up. This 7-bit counter 312 is decoded by a decoder 313 to sequentially select memory cells of the ROM 307.

Figure 10:
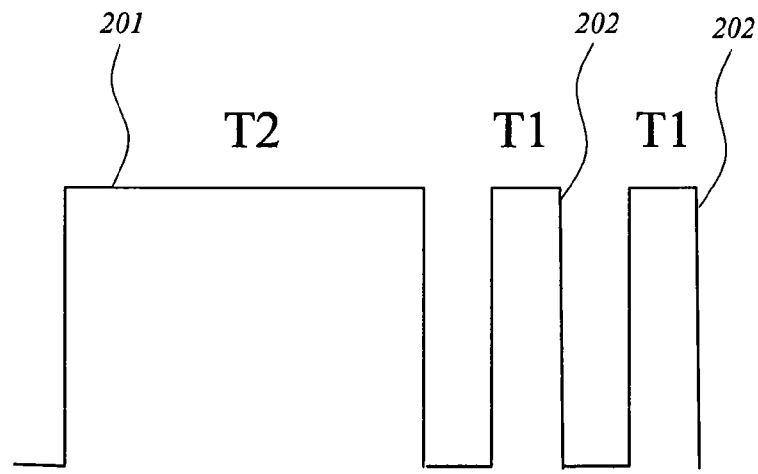
FIG. 10 is a waveform diagram of a signal transmitted from a reader of the wireless IC tag.

FIG. 10 shows an example of a waveform showing a signal from the reader. By combining a signal waveform 201 having a long pulse width (T2) and a signal waveform 202 having a short pulse width (T1), information can be briefly transmitted from the reader to the semiconductor chip 5. In the method using the signal combination, the signal waveform 201 having a long pulse width (T2) is used to set a page number in the semiconductor chip 5 in the counter and to count up the counter, thereby efficiently performing the congestion control. Also, by the signal waveform 201 having a long pulse width (T2), an address position is indicated and the data writing to the semiconductor chip 5 can be performed. When a long pulse and a short pulse are combined, by reducing the total number of pulses a ratio of the long pulse to the short pulse, a processing for the semiconductor chip 5 is completed in a short time. In this case, when the time difference in the pulse width is reduced between the long pulse and the short pulse, the efficiency can be improved. In order to detect the time difference in the pulse width, the accuracy improvement in the pulse width detection circuit 305 in the semiconductor chip 5 is necessary. For its achievement, a product of the resistance value and the capacitance value is made constant by adjusting either or both of the resistance value and the capacitance value of the pulse width detection circuit 305.

Figure 11:
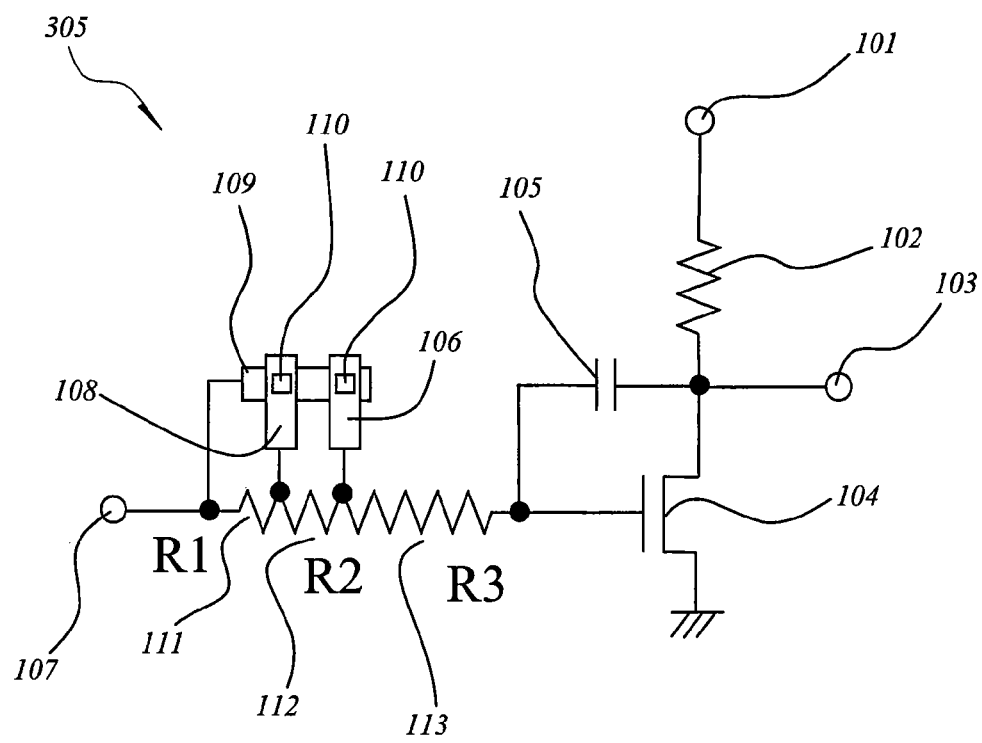
FIG. 11 is a circuit diagram of a pulse width detection circuit formed in the semiconductor chip of the wireless IC tag according to one embodiment of the present invention.

FIG. 11 is a circuit diagram of the pulse width detection circuit 305. A power supply terminal 101 is connected to one end of a resistor 102 and an output terminal 103 is connected to the other end of the resistor 102. The output terminal 103 is connected to a transistor 104 and a capacitor 105. Divided resistors 111, 112 and 113 are connected to a gate input of the transistor 104, and one terminal of the divided resistor 111 is to be an input terminal 107. One ends of upper layer metal wirings 106 and 108 and a lower layer metal wiring 109 are connected to the divided resistors 111, 112 and 113. In addition, through hole candidate positions 110 are formed between the upper layer metal wiring 106 and the lower layer metal wiring 109 and between the upper layer metal wiring 108 and the lower layer metal wiring 109 for connecting them.

The pulse width detection circuit 305 is a circuit in which a change in the output terminal 103 depends on a product of a resistance value and a capacitance value in accordance with a change in the input terminal 107. The resistance is determined by the divided resistors 111, 112 and 113, and the capacitance is determined by the capacitor 105. The product of the resistance value and the capacitance value is a product of the resistance value determined by the sum of the divided resistors 111, 112 and 113 and the capacitance value determined by the capacitor 105. When the product is constant, time setting determined by this product is constant and can be utilized for detecting a signal waveform.

The divided resistors 111, 112, and 113 and the capacitor 105 are formed through a well-known semiconductor manufacturing process. In other words, the divided resistors 111, 112 and 113 are formed of a diffusion layer in a semiconductor substrate and a polycrystalline silicon film on a semiconductor substrate and the like, and the capacitor 105 is formed of a gate capacitance of the transistor 104 and a capacitance between metal wirings.

It is difficult to repeatedly manufacture the divided resistors 111, 112 and 113 and the capacitor 105 with uniform values due to variation in manufacturing conditions. Therefore, in the present embodiment, a resistor is divided into the divided resistors 111, 112 and 113, and one of the through hole candidate positions 110 is selected to form a through hole depending on the finishing state of the resistors. By doing so, the resistance value is adjusted. At this time, when the through hole is formed by a photolithography technology using a photomask, problems such as generation of mask cost and reduction in design flexibility are caused. However, when the through hole is formed by using the electron beam writing method, these problems can be prevented.

Figure 12:
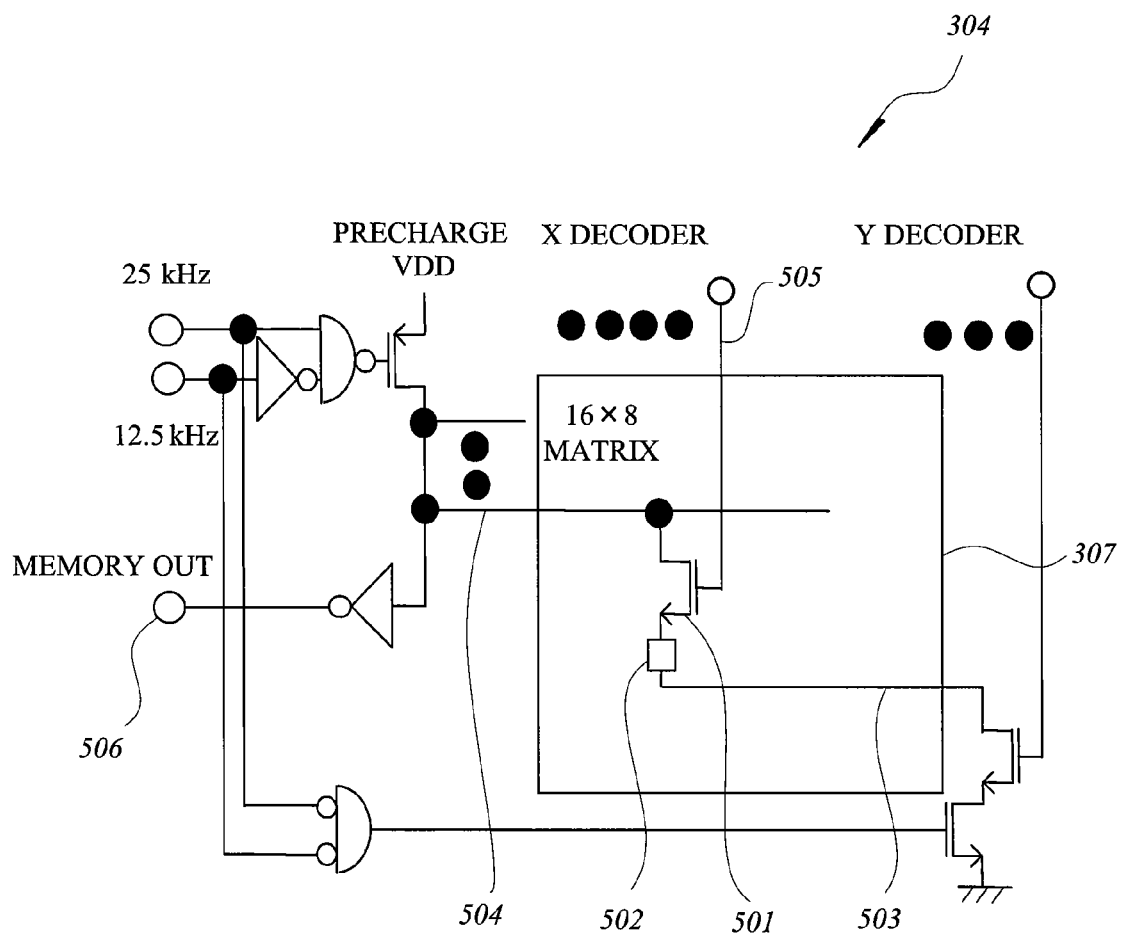
FIG. 12 is a circuit diagram of a memory circuit formed in the semiconductor chip of the wireless IC tag according to one embodiment of the present invention.

FIG. 12 is a circuit diagram of the memory circuit 304. Source sides of respective 128 transistors 501 (only one is shown in FIG. 12) constituting the ROM 307 are connected to word lines 503 via connecting points 502, and drain sides thereof are connected to a common power supply line 504. Gates of the transistors 501 are connected to decode lines 505 from a memory counter so as to sequentially select the transistors 501.

Since the gate of the selected transistor 501 electrically becomes H level, when the connecting point 502 is short-circuited by electron beam, current flows between the drain and the source and charges accumulated in a parasitic capacitance (not shown) of the power supply line 504 are discharged. With this discharge, the power supply line 504 becomes L level and a memory OUT output 506 becomes H level. The power supply line 504 accumulates charges in the parasitic capacitance so that it temporarily becomes H level before the gate of the transistor 501 becomes H level. As described above, it is possible to arbitrarily set the short circuit of the wiring and the disconnection state thereof by using the electron beam writing.

Figure 13:
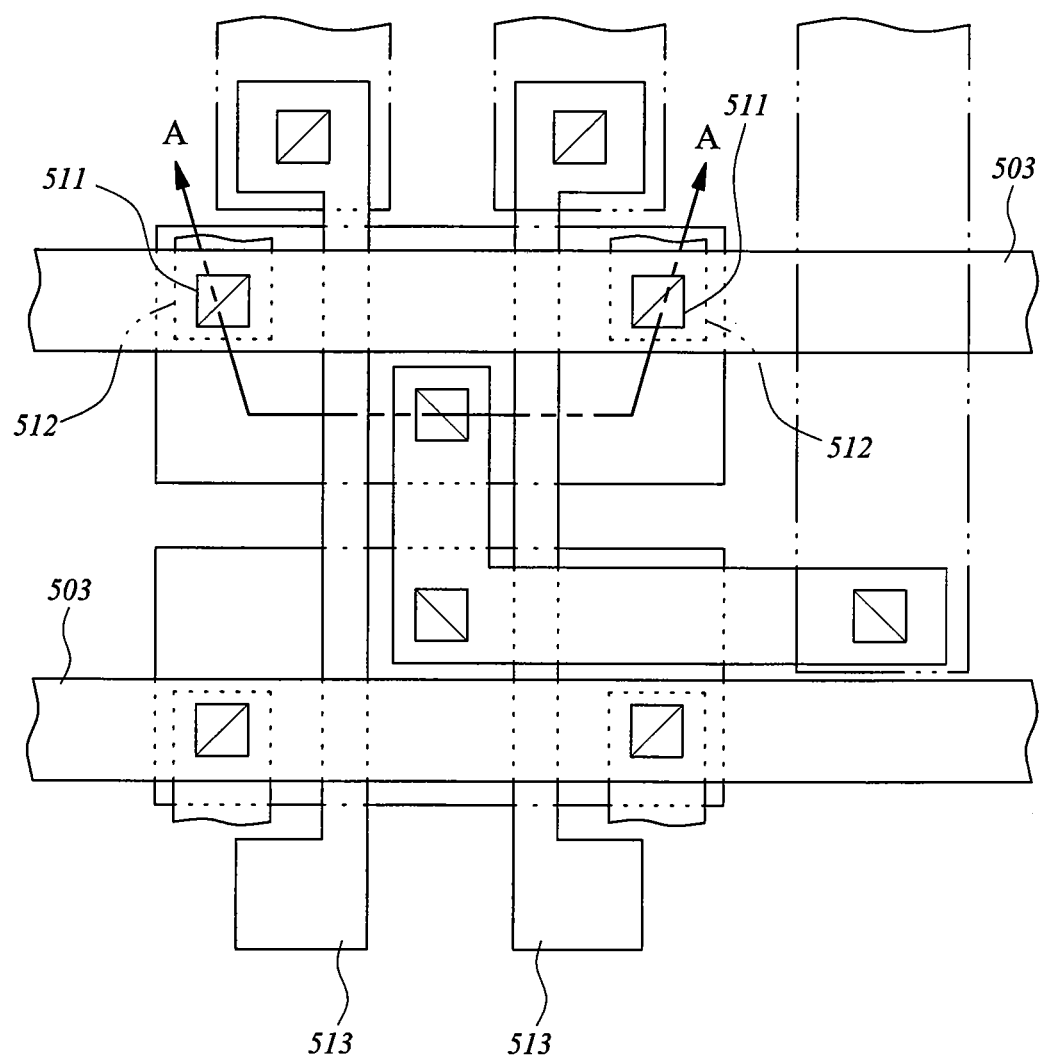
FIG. 13 is a plan view showing essential parts of the memory circuit formed in the semiconductor chip of the wireless IC tag according to one embodiment of the present invention.
Figure 14:
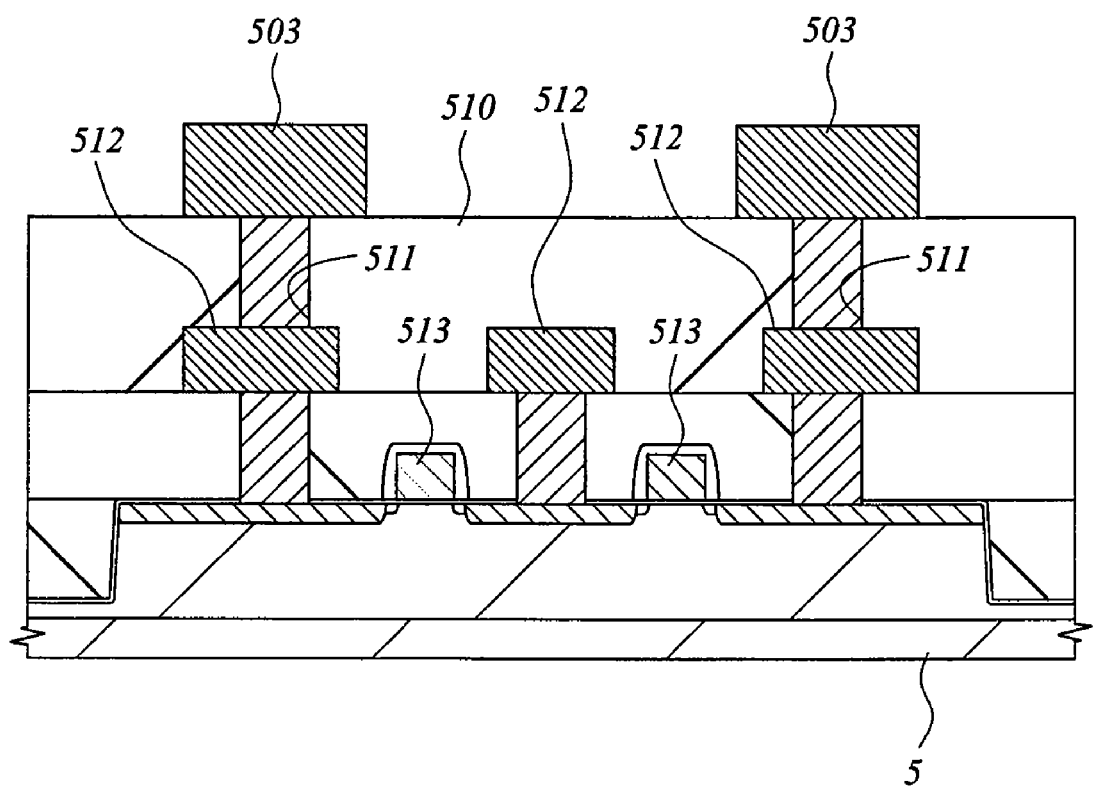
FIG. 14 is a cross-sectional view taken along the line A-A of FIG. 13.

FIG. 13 is a plan view showing essential parts of the memory circuit 304, and FIG. 14 is a cross-sectional view taken along the line A-A of FIG. 13. The word line 503 constituting a part of the upper layer metal wiring is connected to a source wiring 512 via a through hole 511 formed in an interlayer insulating film 510. A gate electrode 513 is shared among a plurality of transistors (memory cells) constituting the ROM (307). The identification number is written by forming the through holes 511 at the through hole candidate positions of the interlayer insulating film 510 by electron beam.

Figure 15:
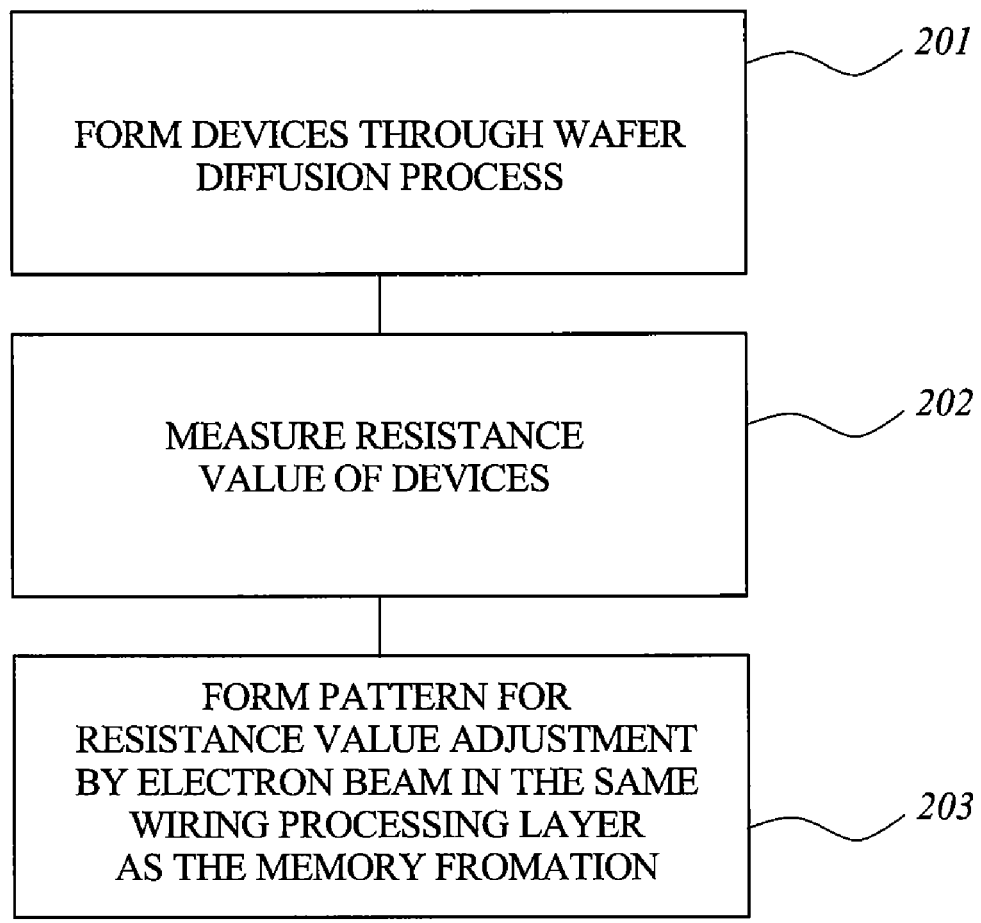
FIG. 15 is a flow diagram of a manufacturing process of the wireless IC tag according to one embodiment of the present invention.

FIG. 15 is a flow diagram showing a manufacturing process of the circuit shown in FIG. 8. First, devices (transistor, resistor, capacitor) constituting the circuit are formed through the semiconductor wafer diffusion process (step 201). At this time, the transistors and others constituting the ROM 307 are formed in the memory circuit 304, and the resistor 306 and others are formed in the pulse width detection circuit 305.

Next, an electric resistance value of the resistor 306 formed in the pulse width detection circuit 305 is measured (step 202). The resistance value is measured by using a well-known probe or the like. Here, some resistors 306 formed in the semiconductor wafer are selected and their resistance values are measured, and their finishing states are converted into numerical values. Then, the deviation from the reference value is obtained based on the numerical values to determine whether to adjust the resistance value. When it is determined that the adjustment is necessary, the resistance value is set and a length of the resistor 306 corresponding to this resistance value is obtained. Thereafter, the position pattern of the through holes is determined based on this resistor length (step 203).

Figure 16:
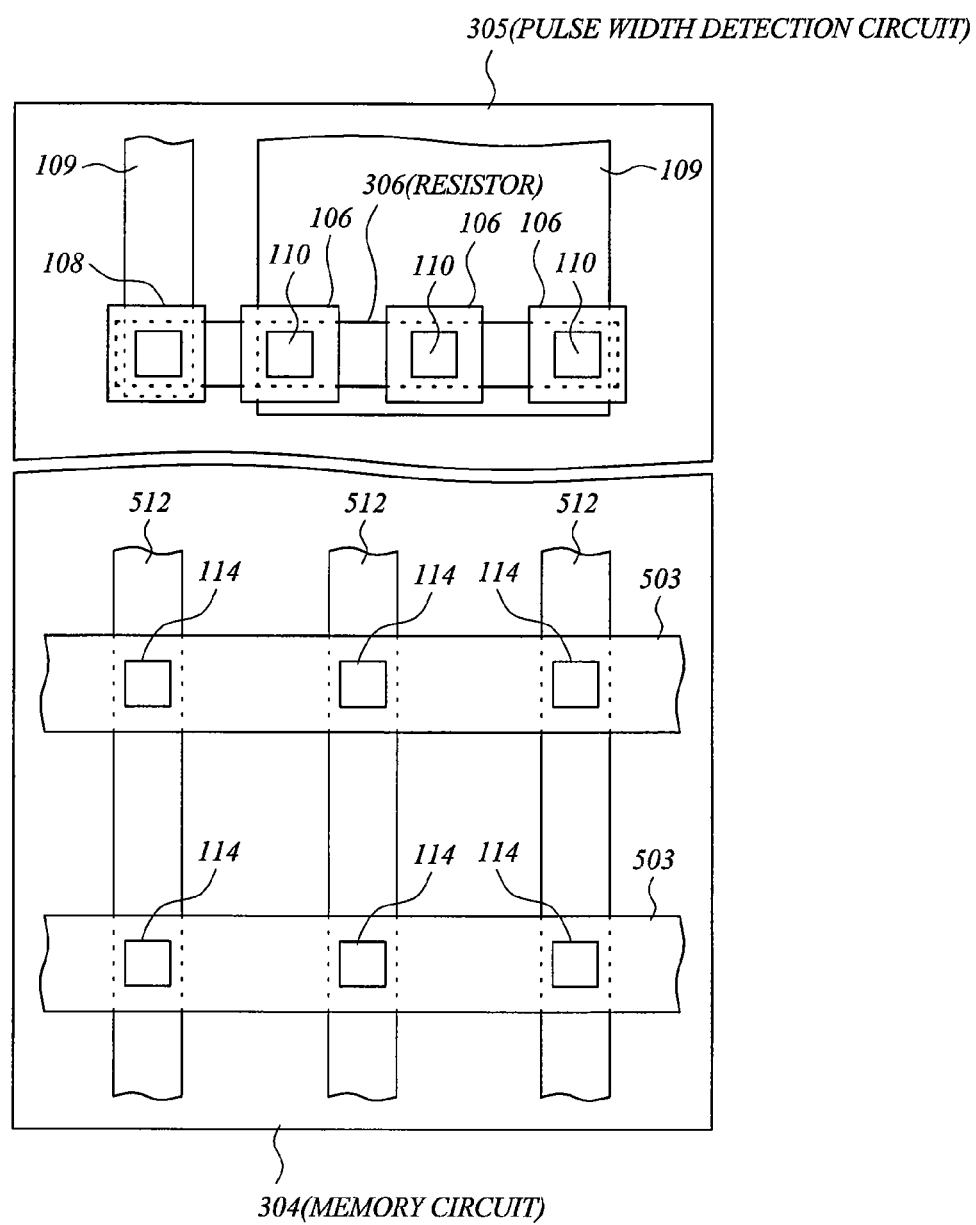
FIG. 16 is a plan view of the pulse width detection circuit and the memory circuit showing candidate positions of through holes formed by an electron bean writing method.

FIG. 16 is a plan view showing candidate positions of the through holes formed by the electron beam writing method. In the memory circuit 304, the through hole candidate positions 114 are present between the source wirings 512 and the word lines 503 shown in FIG. 14, and in the pulse width detection circuit 305, the through hole candidate positions 110 are present between the lower layer metal wiring 109 and the upper layer metal wirings 106 and 108 shown in FIG. 11. The resistor 306 shown in FIG. 16 corresponds to the divided resistors 111, 112 and 113 in FIG. 11.

Figure 17:
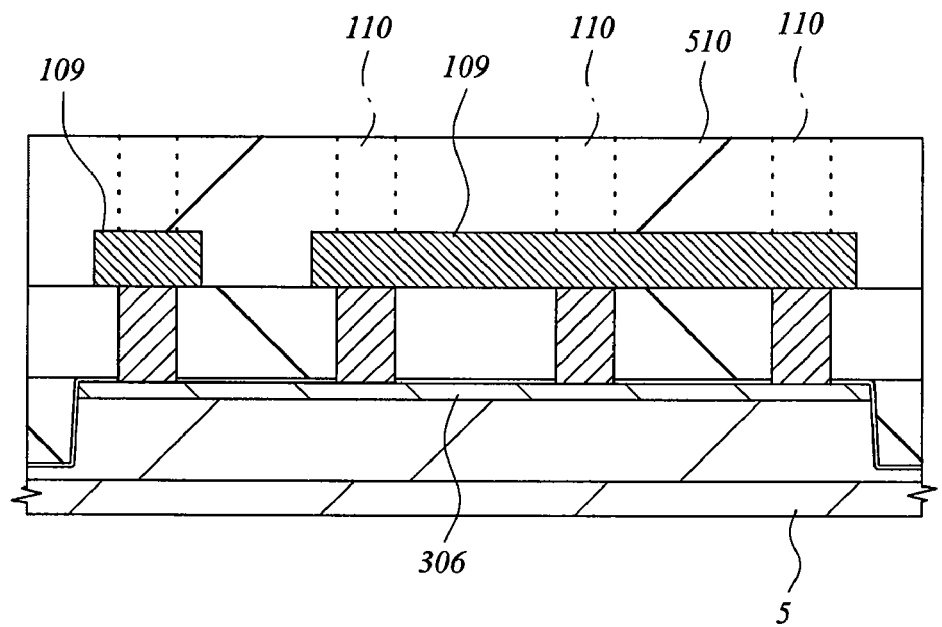
FIG. 17 is a cross-sectional view showing the pulse width detection circuit at the time when the step (201) shown in FIG. 15 is completed.
Figure 18:
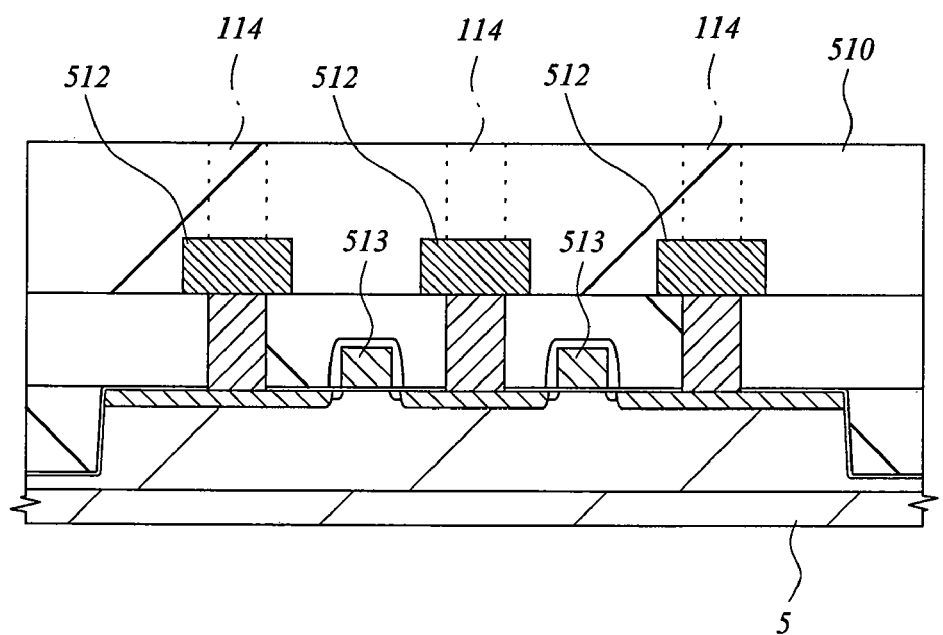
FIG. 18 is a cross-sectional view showing the memory circuit at the time when the step (201) shown in FIG. 15 is completed.

FIG. 17 is a cross-sectional view showing the pulse width detection circuit 305 at the time when the step 201 shown in FIG. 15 is completed. Portions in the interlayer insulating film 510 shown by dashed lines are the through hole candidate positions 110. FIG. 18 is a cross-sectional view showing the memory circuit 304 at the time when the step 201 shown in FIG. 15 is completed. Portions in the interlayer insulating film 510 shown by dashed lines are the through hole candidate positions 114. Next, the electric resistance value of the resistor 306 is measured in step 202 and the position pattern of the through holes is determined in step 203 shown in FIG. 15. On the other hand, in order to write the identification number unique to the wireless IC tag 1 to the ROM (307) of the memory circuit 304, a random number is generated by a program so as to determine the positions of the through holes.

Figure 19:
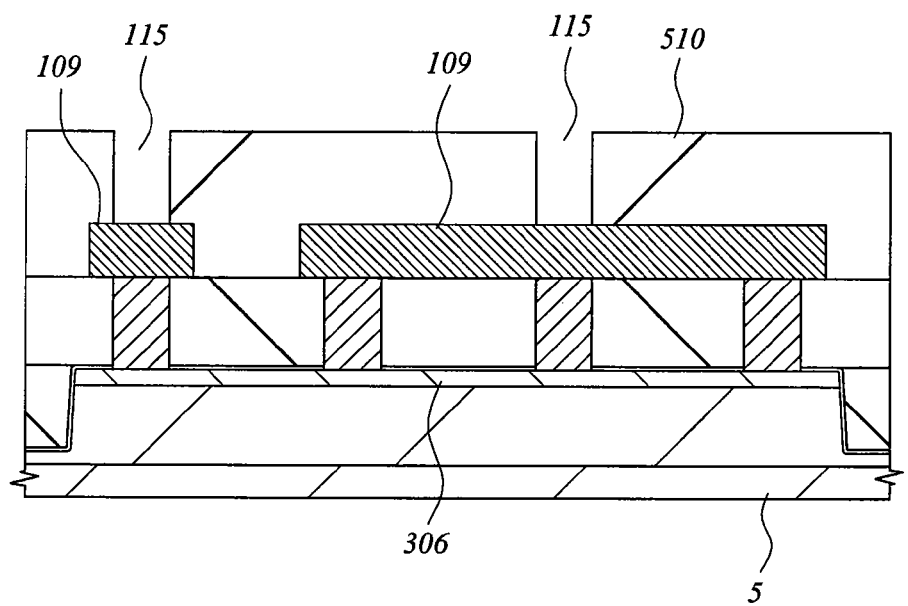
FIG. 19 is a cross-sectional view of the pulse width detection circuit showing a step of forming a through hole by using the electron beam writing method.
Figure 20:
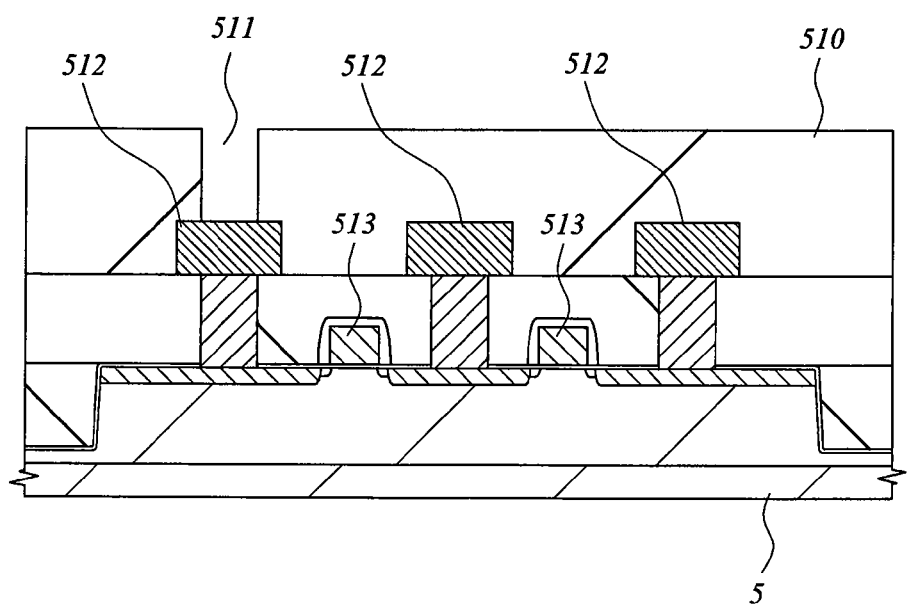
FIG. 20 is a cross-sectional view of the memory circuit showing a step of forming a through hole by using the electron beam writing method.
Figure 21:
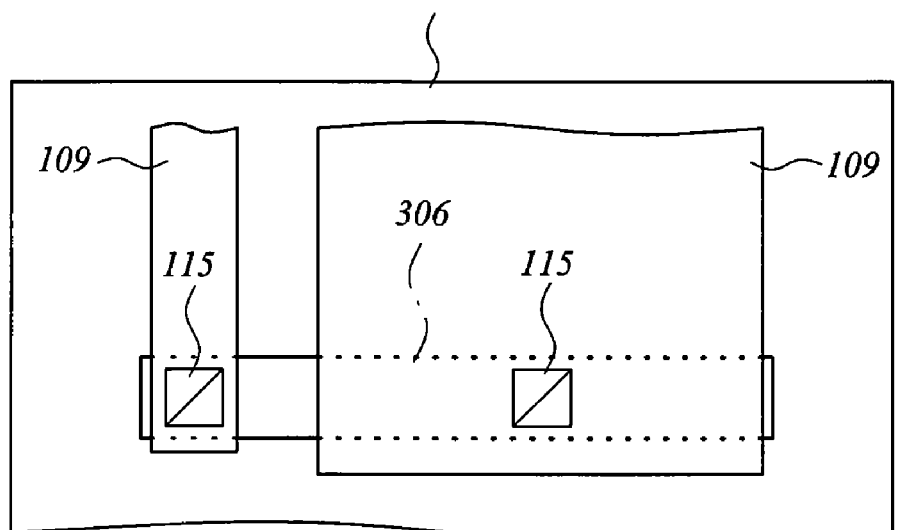
FIG. 21 is a plan view of the pulse width detection circuit and the memory circuit showing a step of forming a through hole by using the electron beam writing method.
Figure 21:
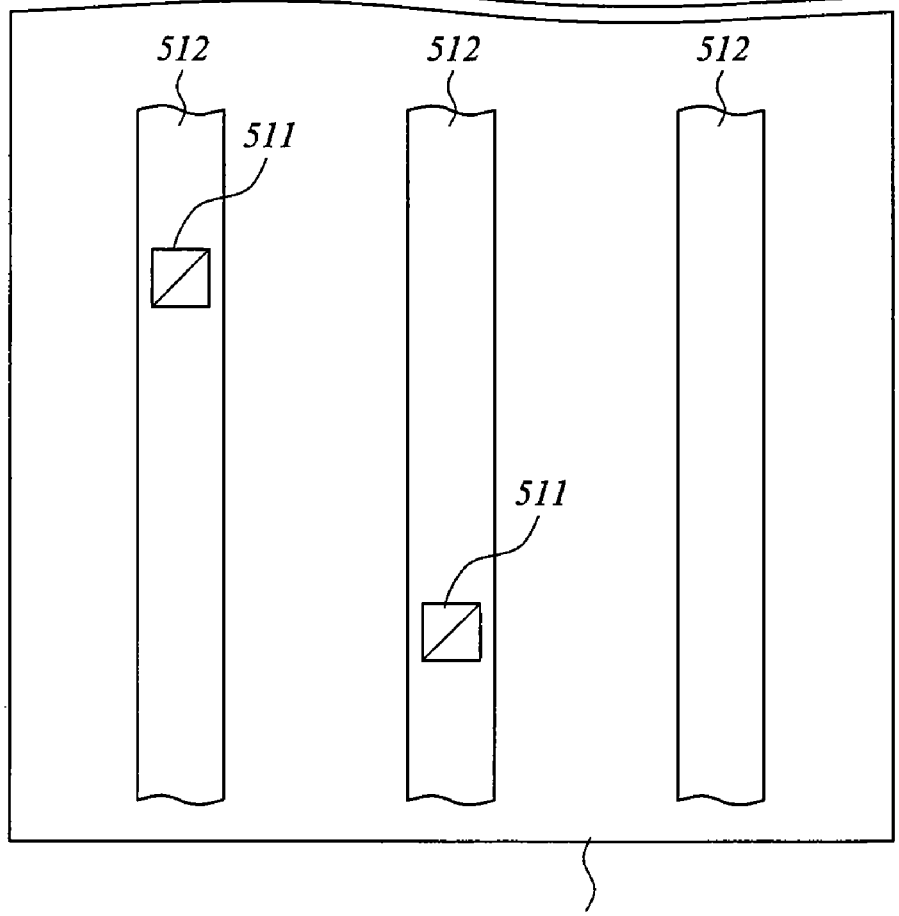

Next, as shown in FIG. 19 and FIG. 21, through holes 115 are formed in the interlayer insulating film 510 of the pulse width detection circuit 305 by using the electron beam writing method. At this time, as shown in FIG. 20 and FIG. 21, the through holes 511 are formed also in the interlayer insulating film 510 of the memory circuit 304.

Figure 22:
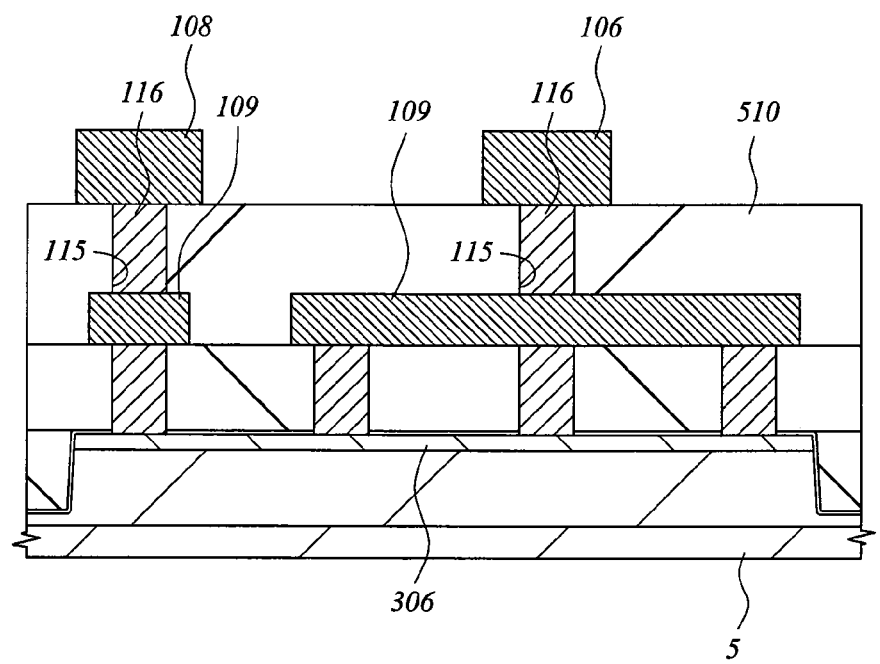
FIG. 22 is a cross-sectional view of the pulse width detection circuit showing a manufacturing step subsequent to FIG. 19.
Figure 23:
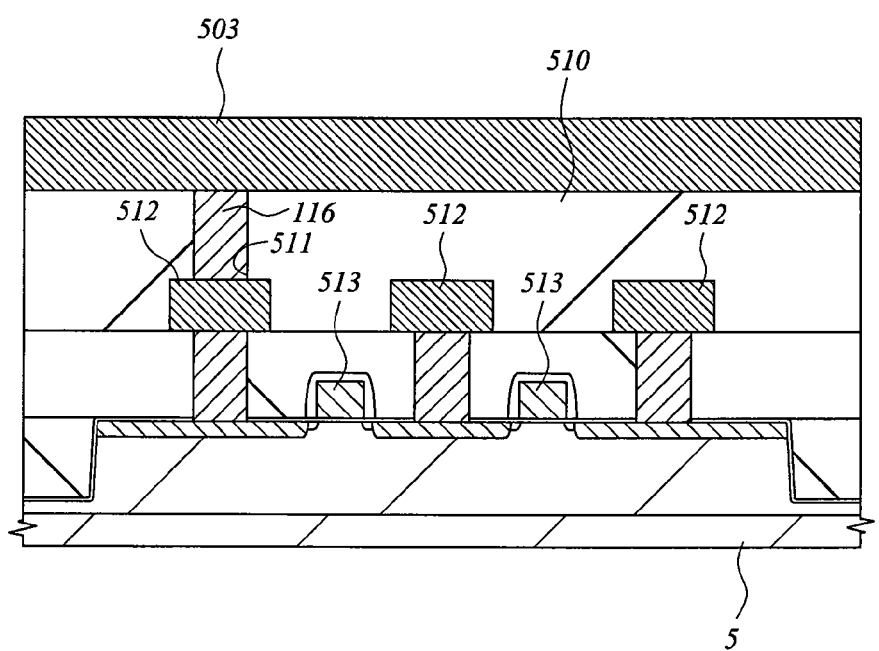
FIG. 23 is a cross-sectional view of the memory circuit showing a manufacturing step subsequent to FIG. 20.

Next, as shown in FIG. 22 and FIG. 23, after metal plugs 116 are embedded in the through holes 115 and 511, the upper layer metal wirings 106 and 108 are formed on the interlayer insulating film 510 of the pulse width detection circuit 305, and the word line 503 is formed on the interlayer insulating film 510 of the memory circuit 304.

As described above, the resistance value of the pulse width detection circuit 305 is adjusted by the electron beam writing method while utilizing the step of writing the identification number unique to the wireless IC tag 1 into the ROM (307) of the memory circuit 304. Therefore, it is possible to achieve the advanced wireless IC tag 1 without causing the cost increase due to the increase in the number of steps and photomasks.

In the foregoing, the invention made by the inventor of the present invention has been concretely described based on the embodiments. However, it is needless to say that the present invention is not limited to the foregoing embodiments and various modifications and alterations can be made within the scope of the present invention.

In the embodiment described above, the case where the resistance value of the pulse width detection circuit is adjusted has been described. However, the capacitance value of the capacitor can be adjusted in the same manner. Further, it is possible to set the position or shape of the through hole in an analog manner and to automatically generate the shape in a program manner.

Furthermore, it is possible to adjust not only the resistance and capacitance of the pulse width detection circuit but also the characteristics of other devices such as transistor and diode by the electron beam writing method.

INDUSTRIAL APPLICABILITY

The present invention can be applied to the achievement of an advanced wireless IC tag.

The invention claimed is:

1. A wireless IC tag comprising:
a semiconductor chip having:
  a memory circuit including a ROM in which a unique identification number is written; and
  a pulse width detection circuit that detects a clock signal of varying pulse width transmitted from a reader based on resistance and capacitance values of the pulse width detection circuit,
wherein the unique identification number is written into the ROM depending on the presence of a first through hole for conduction between an upper layer wiring and a lower layer wiring connected to a transistor of the ROM,
wherein the pulse width detection circuit has a resistor,
wherein the resistance value of the resistor of the pulse width detection circuit is based on the presence of a second through hole for conduction between the upper and lower layer wirings, which are each connected to the resistor at different points, and
wherein the first through hole and the second through hole are formed in a same insulating layer on the semiconductor chip.

2. The wireless IC tag according to claim 1, further comprising:
an insulating film; and
an antenna made of a conductive film formed on one surface of the insulating film,
wherein the semiconductor chip is electrically connected to the antenna.

3. The wireless IC tag according to claim 2, wherein the semiconductor chip is electrically connected to the antenna via bump electrodes and is sealed by resin.

4. The wireless IC tag according to claim 1, wherein a frequency of the clock signal transmitted from the reader is 2.45 GHz.

5. The wireless IC tag according to claim 1, wherein the resistance is made of a diffusion resistance.

6. A wireless IC tag comprising:
a semiconductor chip having:
  a memory circuit including a ROM in which a unique identification number is written; and
  a pulse width detection circuit that detects a clock signal of varying pulse width transmitted from a reader based on resistance and capacitance values of the pulse width detection circuit,
wherein the unique identification number is written into the ROM depending on the presence of a first through hole for conduction between an upper layer wiring and a lower layer wiring connected to a transistor of the ROM,
wherein the pulse width detection circuit has a resistor, wherein the resistance value of the resistor of the pulse width detection circuit is controlled by a position of a second through hole for conduction between the upper and lower layer wirings connected to the resistor, wherein the capacitance value of the pulse width detection circuit is controlled by a position of a third through hole for conduction between the upper and lower layer wirings connected to the capacitor, and wherein the first, second, and third through holes are formed in a same insulating layer on the semiconductor chip.

* * * * *